US006359809B1

United States Patent
Tedrow et al.

(10) Patent No.: US 6,359,809 B1
(45) Date of Patent: *Mar. 19, 2002

(54) OSCILLATOR FOR SIMULTANEOUSLY GENERATING MULTIPLE CLOCK SIGNALS OF DIFFERENT FREQUENCIES

(75) Inventors: Kerry D. Tedrow; Jeffrey J. Evertt, both of Folsom, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/988,225

(22) Filed: Dec. 10, 1997

(51) Int. Cl.[7] .............................................. G11C 16/04
(52) U.S. Cl. ......................... 365/185.29; 365/189.09; 365/233
(58) Field of Search .......................... 331/1 A, 34, 57, 331/173, 177 R, 185, 186; 365/233, 189.09, 185.29

(56) References Cited

U.S. PATENT DOCUMENTS

| | | | | |
|---|---|---|---|---|
| 3,849,635 A | * | 11/1974 | Freedman | 235/92 CC |
| 4,206,618 A | * | 6/1980 | White, Jr. et al. | 365/222 |
| 4,293,932 A | | 10/1981 | McAdams | |
| 4,333,167 A | | 6/1982 | McElroy | |
| 4,344,157 A | | 8/1982 | White, Jr. et al. | |
| 4,918,510 A | * | 4/1990 | Pfiester | 357/42 |
| 5,266,890 A | * | 11/1993 | Kumbasar et al. | 324/158 R |
| 5,270,666 A | * | 12/1993 | Rapeli et al. | 329/341 |
| 5,410,510 A | * | 4/1995 | Smith et al. | 331/57 X |
| 5,638,028 A | * | 6/1997 | Voth | 331/25 |
| 5,937,023 A | * | 8/1999 | Wu | 377/19 |
| 6,188,355 B1 | * | 2/2001 | Gilboa | 342/448 |

* cited by examiner

Primary Examiner—Vu A. Le
(74) Attorney, Agent, or Firm—Blakely, Sokoloff, Taylor & Zafman LLP

(57) ABSTRACT

A low frequency oscillator is described. The low frequency oscillator has a bias circuit including a metal-oxide semiconductor (MOS) resistor. A biased ring oscillator is coupled to the bias circuit. The biased ring oscillator includes multiple current limiting transistors.

22 Claims, 16 Drawing Sheets

OSCILLATOR FOR SIMULTANEOUSLY GENERATING MULTIPLE CLOCK SIGNALS OF DIFFERENT FREQUENCIES

FIELD OF THE INVENTION

The present invention relates generally to providing a low frequency oscillator and, more particularly, to providing a low power low frequency oscillator for enabling voltage regulation circuitry in memory arrays.

BACKGROUND OF THE INVENTION

Many computing systems such as personal computers, automotive and airplane control, cellular phones, digital cameras, and handheld communication devices use nonvolatile writeable memories to store either data, or code, or both. Such nonvolatile writeable memories include Electrically Erasable Programmable Read-Only Memories (EEPROMs) and flash Erasable and Electrically Programmable Read-Only Memories (flash EPROMs, or flash memories). Non-volatility is advantageous for allowing the computing system to retain its data and code when power is removed from the computing system. Thus, if the system is turned off or if there is a power failure, there is no loss of code or data.

Nonvolatile semiconductor memory devices are fundamental building blocks in prior art computer system designs. The primary mechanism by which data is stored in nonvolatile memory is the memory cell. One type of prior nonvolatile semiconductor memory is the flash electrically-erasable programmable read-only memory (flash EEPROM). Prior art flash EEPROMs typically allow for the simultaneous reading of several flash cells. Further, typical prior art flash EEPROMs have a storage capacity that is much greater than the amount of data that can be output at any one time. Accordingly, each output of a flash EEPROM is typically associated with an array of flash cells that is arranged into rows and columns, where each flash cell in an array is uniquely addressable. When a user provides an address, row and column decoding logic in the flash EEPROM selects the corresponding flash cell.

Many electronic systems that take advantage of flash memories are small portable devices that rely on resident batteries for power. Consequently, it is advantageous to reduce the power consumption of these devices in order to increase the length of time between battery chargings. Furthermore, it is advantageous to reduce the size of the internal circuitry of these devices so as to make the portable devices as small in size and light in weight as possible. The power consumption is reduced in many portable electronic devices by operating specific components in a lower power standby mode during periods when these components are not required. Typically, this low power standby mode will reduce the overall current consumed by the component or circuit.

FIG. 1 is a typical prior art flash memory circuit 100 used in a low power standby mode. The positive charge pump 102 provides a regulated voltage of approximately five volts over decoder supply line 106 to the X-decoder 110 of the memory array 112. The negative charge pump 104 provides a voltage of approximately negative five volts over decoder supply line 108 to the X-decoder 110 of the memory array 112. The wordline voltages should be controlled during read operations in multiple level cell flash memories in order to reliably interpret the states. Therefore, in a standby mode, this circuit should maintain these wordline voltages and a reference voltage source 116 while minimizing the current drawn by the circuit. Maintaining these wordline voltages requires current, however, because the junctions and diffusions on the nodes of the positive pump 102, the negative pump 104, and the voltage reference 116 result in a current leakage while the circuit is in the standby mode. The most power efficient method of accommodating this leakage current is to periodically pulse, or refresh, the positive pump 102, the negative pump 104, and the voltage reference 116 using an oscillator 114.

A problem with the typical prior art flash memory circuit 100 is that the leakage current is not the same for the voltage reference 116, the positive pump 102, and the negative pump 104. Typically, the positive pump 102 touches more diffusion resulting in more leakage, so the positive pump 102 has the highest refresh rate, approximately 100 microseconds. The voltage reference has a refresh rate of approximately 1 millisecond. The negative pump 104 has the slowest refresh rate, approximately 10 milliseconds. Because a typical prior art oscillator only outputs one clock signal, these different refresh rates among components result in the oscillator pulsing at a frequency that is the highest of the frequencies required by any of these components. Thus, as the oscillator pulses at a higher frequency to accommodate the refresh rate of the positive pump 102, the current draw is higher because the negative pump 104 and the voltage reference 116 are being turned on, and drawing current, when they are not required to be turned on. Furthermore, the prior art oscillator design consumes a significant amount of silicon area. Consequently, a low frequency oscillator is needed that periodically enables multiple voltage regulation circuitry components by generating a wide range of multiple low frequency clock signals, the low frequency resulting in lower standby current, while requiring less silicon area than typical prior art designs.

SUMMARY OF THE INVENTION

A low frequency oscillator is described. The low frequency oscillator has a bias circuit including a metal-oxide semiconductor (MOS) resistor. A biased ring oscillator is coupled to the bias circuit. The biased ring oscillator includes multiple current limiting transistors.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A low frequency oscillator (LFO) comprising a bias circuit and a multiple stage biased ring oscillator is described for generating multiple low frequency clock signals. This low frequency oscillator periodically enables voltage regulation circuitry in low-power standby modes in nonvolatile writeable memory, but is not so limited. Intended advantages of the low frequency oscillator can include the consumption of less current, lower frequency clock signals, the reduction of silicon area, better control of frequency resulting from a reduced sensitivity to threshold voltage mismatch, and providing a large range of frequencies. The LFO described herein is described in the context of a nonvolatile writeable memory, or flash memory, but is not so limited.

Figure 1:
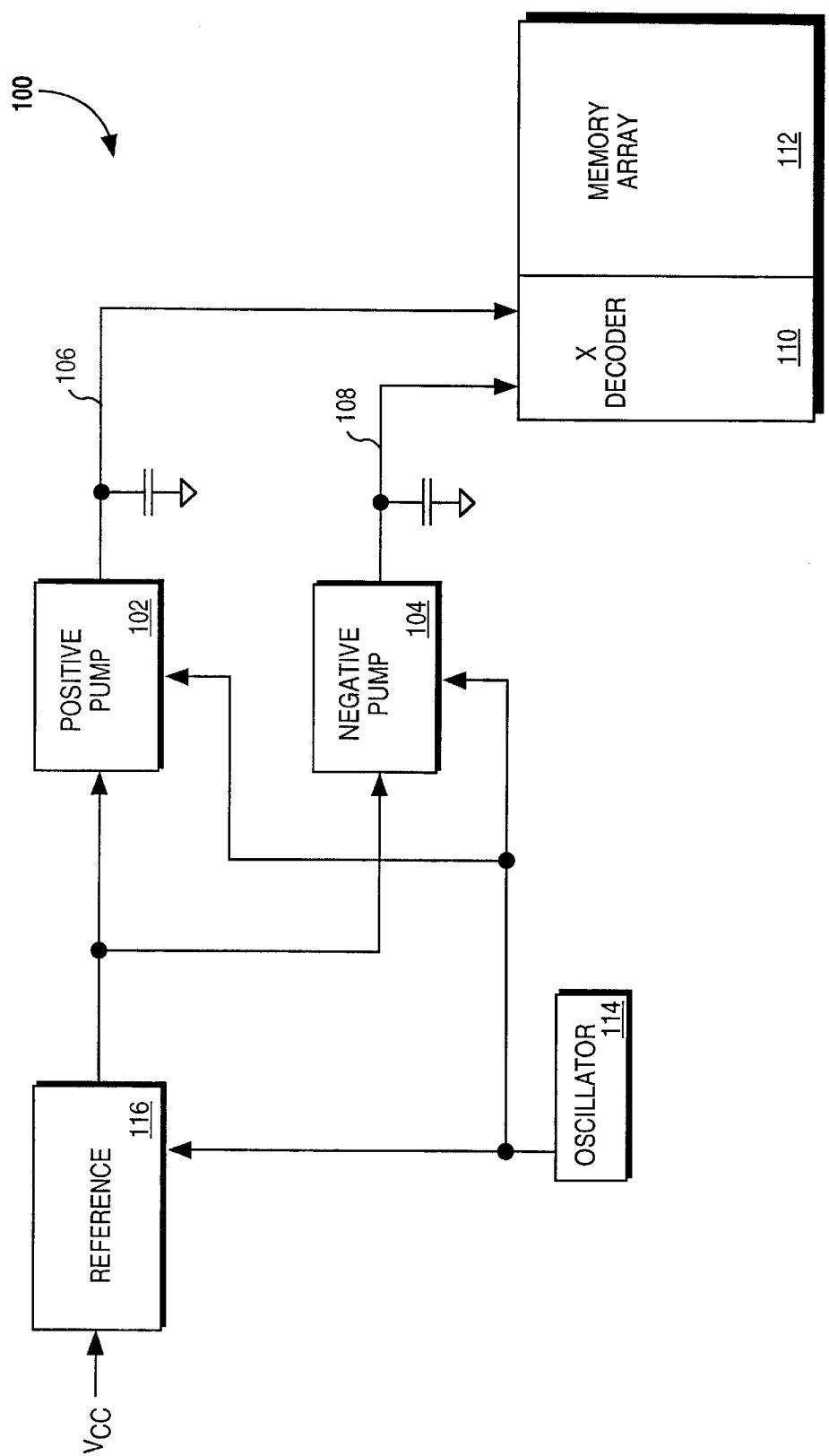
FIG. 1 is a typical prior art flash memory circuit used in a low power standby mode.
Figure 2:
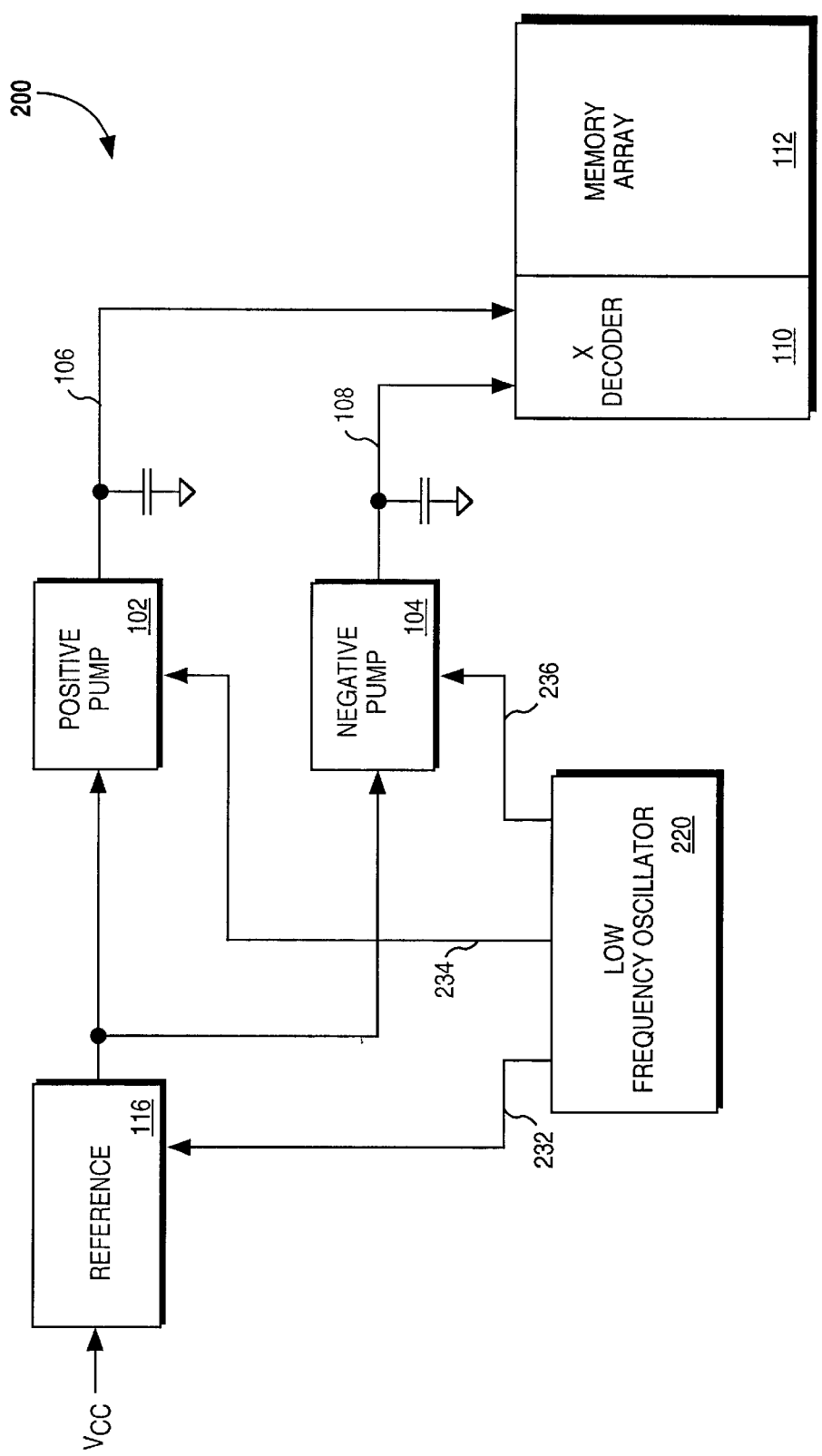
FIG. 2 is a flash memory circuit using the low frequency oscillator in one embodiment.

FIG. 2 is a flash memory circuit 200 using the low frequency oscillator 220 in one embodiment. The voltage reference 116 provides a reference voltage of approximately 2 volts to both the positive pump 102 and the negative pump 104. The positive charge pump 102 provides a regulated voltage of approximately five volts over decoder supply line 106 to the X-decoder 110 of the memory array 112. The negative charge pump 104 provides a voltage of approximately negative five volts over decoder supply line 108 to the X-decoder 110 of the memory array 112. The low frequency oscillator 220 provides low frequency clock signals 232–236 that periodically pulse, or enable, the voltage reference 116, the positive pump 102, and the negative pump 104, respectively, when they are in a standby mode. The low frequency clock signals 232–236 may each have a different frequency, but they are not so limited.

The voltage reference circuit of one embodiment is a sample and hold circuit comprising a large sample capacitor for storing charge. This sample and hold circuit allows for a reduction in current used during the standby mode in spite of the relatively high refresh rate, or frequency, of the positive charge pump. The sample and hold voltage reference circuit reduces the current in standby mode by storing charge on the large capacitor, thereby eliminating the need for the voltage reference circuit to be activated every time the positive charge pump is activated. On the other hand, the voltage reference is turned on each time the negative charge pump is activated because the negative charge pump draws current from the voltage reference.

Figure 3:
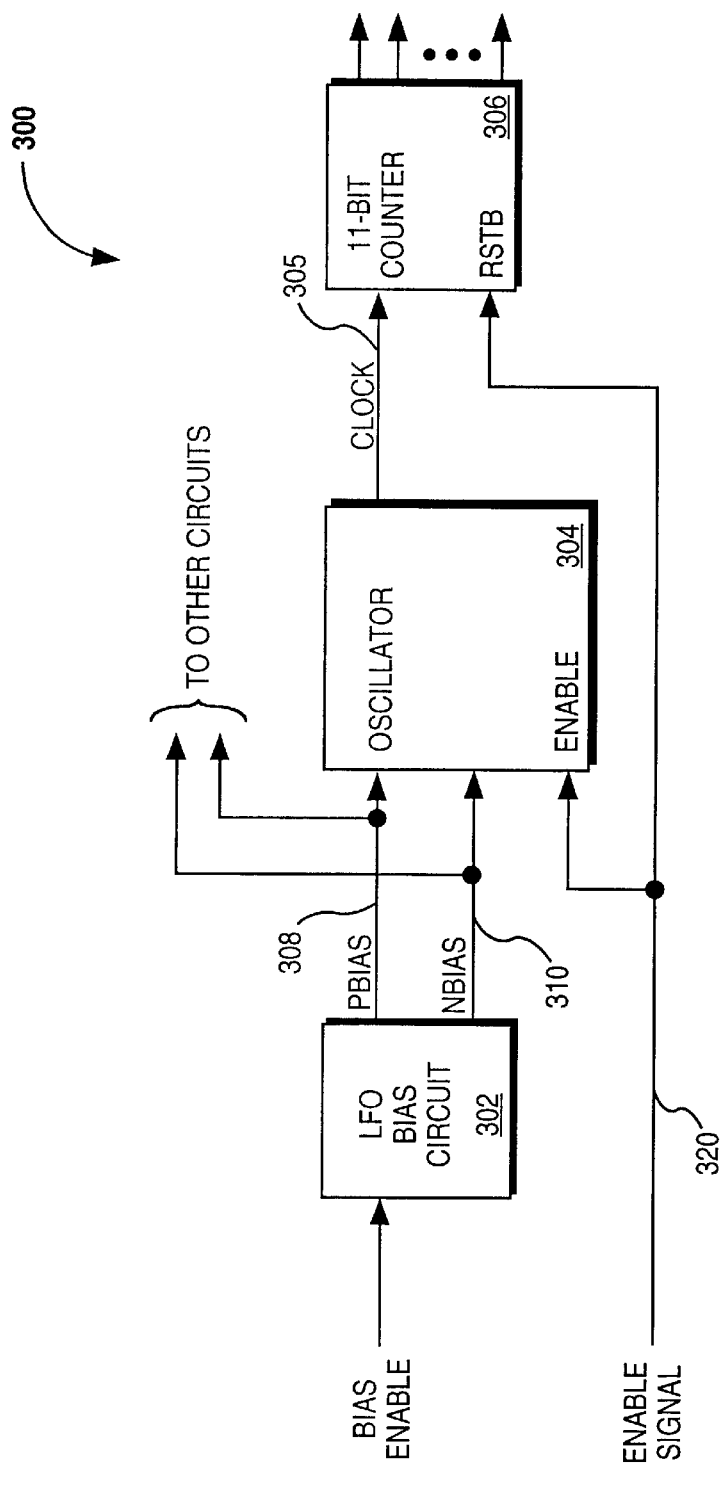
FIG. 3 is a block diagram of the low frequency oscillator of one embodiment.

FIG. 3 is a block diagram of the low frequency oscillator 300 of one embodiment. This LFO 300, when used with a flash memory, is used during the read and standby modes of the flash memory. The LFO 300 comprises an LFO bias circuit 302 coupled to VCC and coupled to receive a bias enable signal. The VCC input to the LFO 300 may be filtered. The LFO bias circuit 302 provides a PBIAS signal 308 output and an NBIAS signal 310 output. The PBIAS 308 and NBIAS 310 signals are coupled to an oscillator 304, along with an enable signal 320. The enable signal 320 is used when the LFO 300 is used with a flash memory because the oscillator 304 and the counter 306 are disabled during the program and erase cycles of the flash memory, and because the oscillator 304 and the counter 306 are turned off during periods when VCC is detected as being low, or less than a specified threshold. The PBIAS 308 and NBIAS 310 signals may also be coupled to other circuits requiring a low bias current. The oscillator 304 provides a clock signal output 305 coupled to an 11-bit counter 306. The 11-bit counter 306 also receives the enable signal 320 input. The 11-bit counter 306 provides 11 different outputs wherein each output has a different frequency.

Figure 4:
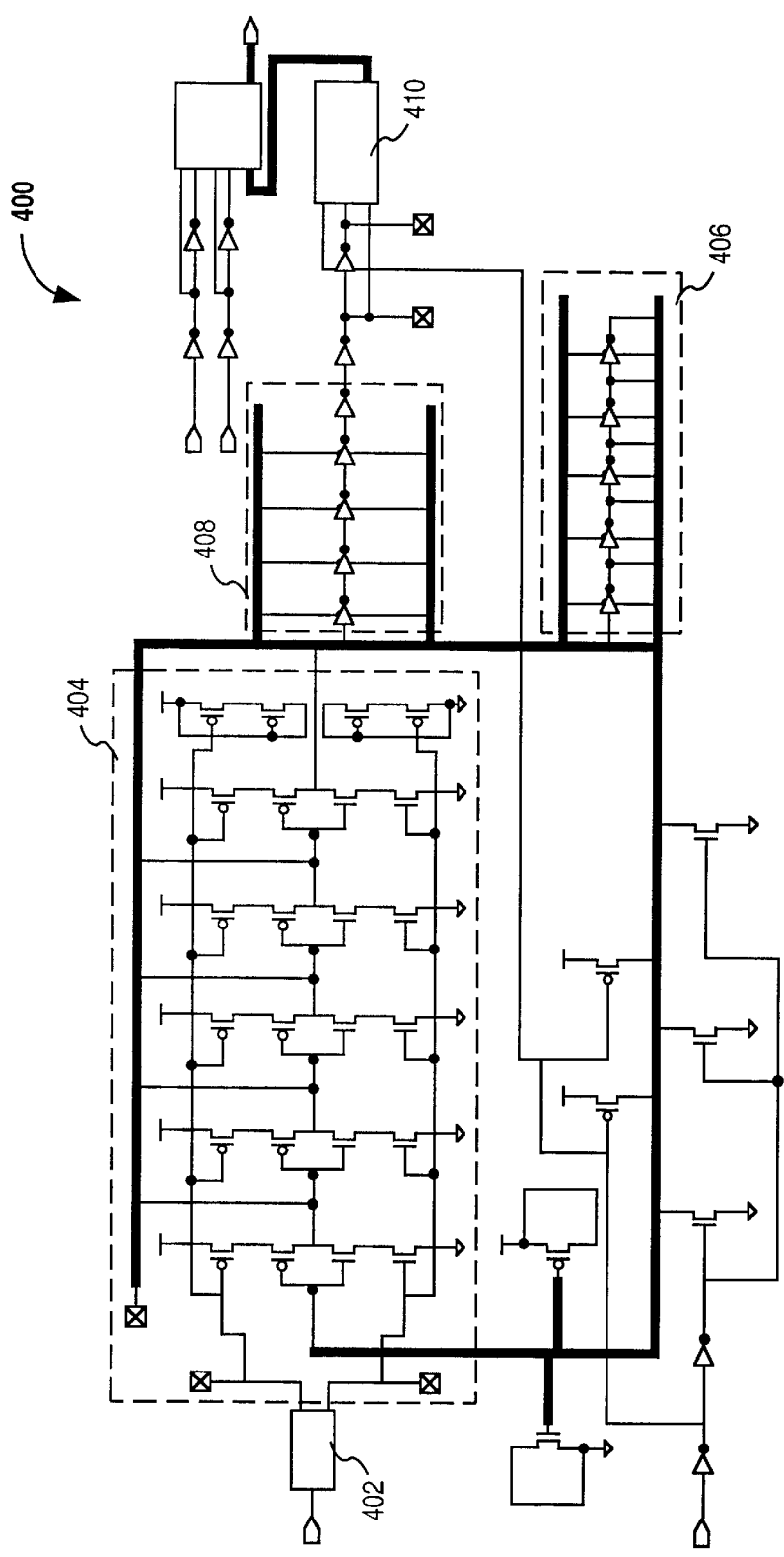
FIG. 4 is a schematic of the LFO of one embodiment.

FIG. 4 is a schematic of the LFO 400 of one embodiment. The LFO comprises a bias circuit 402, a ring oscillator circuit 404, a keeper circuit 406, an edge sharpener circuit 408, and an 11-bit counter 410. Each of these circuits and their functions are discussed herein.

Figure 5:
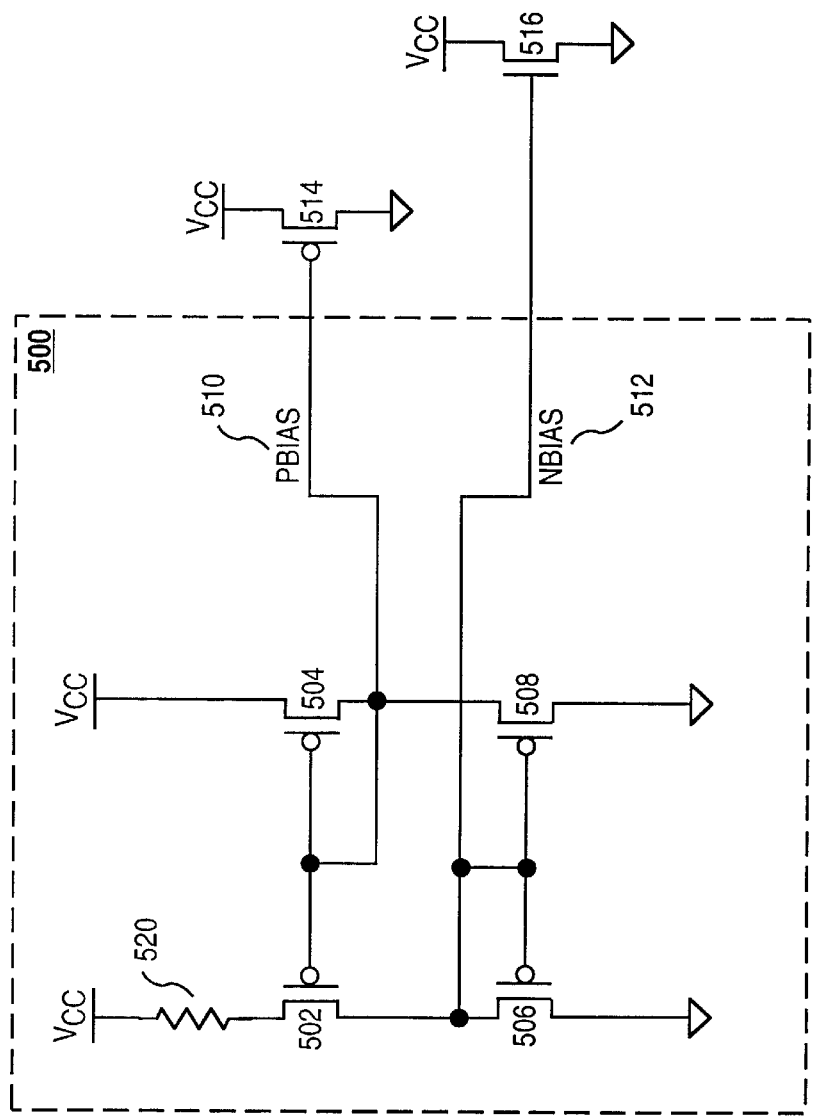
FIG. 5 is the bias circuit of one embodiment.

FIG. 5 is the bias circuit 500 of one embodiment. The bias circuit 500 comprises two cross-coupled current mirrors. The p-channel device mirror is comprised of two p-channel devices 502 and 504. The n-channel device mirror is comprised of two n-channel devices 506 and 508. The bias circuit 500 generates two voltages PBIAS 510 and NBIAS 512 that are used as current mirrors to induce like currents in like size p-channel 514 and n-channel 516 devices.

The bias circuit 500 further comprises a metal-oxide semiconductor (MOS) resistor 520 in the leg of the p-channel mirror, but is not so limited. The MOS resistor 520 is a p-channel MOS device in one embodiment, but is not so limited. The use of this MOS resistor 520 provides much greater resistance per area of silicon than standard diffusion resistors, resulting in a significant reduction in the silicon area of the LFO. Consequently, for the same current consumption and less silicon area, the MOS resistor 520 can be operated with a higher bias voltage thereby reducing the bias current's sensitivity to a threshold voltage mismatch. As threshold voltage mismatch is the primary cause of frequency variations in an LFO, use of the MOS resistor 520 stabilizes the frequency of the clock signals provided by the LFO disclosed herein.

The use of the current mirror containing the MOS resistor 520 results in a smaller ratio of MOS width to diffusion length over the prior art bias circuit using a standard diffusion resistor; this results in a reduced gate drive for transistor 502. As the resistance of a MOS transistor is set by the gate-to-source voltage, Vgs, and the Vgs of the MOS resistor depends on or changes with VCC, then the resistance of the MOS resistor 520 depends on VCC, and consequently, the current through the MOS resistor 520 is proportional to VCC. The VCC dependency of the bias current leads to a VCC independent LFO frequency, as will be explained herein.

Figure 6:
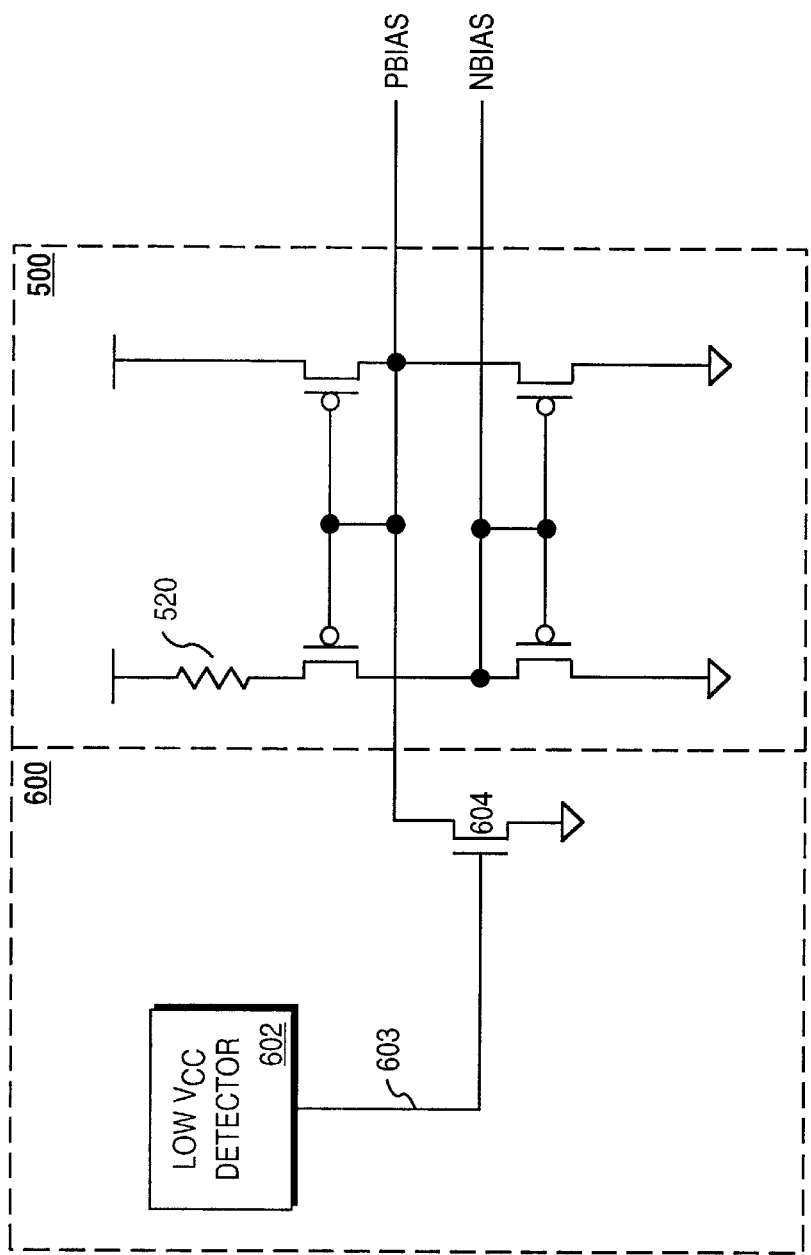
FIG. 6 is the bias circuit with a starting current injection circuit of one embodiment.

FIG. 6 is the bias circuit 500 with a starting current injection circuit 600 of one embodiment. In order to prevent the bias circuit 500 from remaining in a zero-current state upon powerup, a very low VCC detector 602 is used to force a starting current. The very low VCC detector 602, upon detection of a VCC level lower than approximately 1.5 volts, causes a signal 603 to the gate of transistor 604 to be asserted. The asserted signal 603 at the gate of transistor 604 results in an injection of current into the p-channel current mirror of the bias circuit 500. The current is injected until the detected VCC reaches approximately 1.5 volts at which time the signal from the low VCC detector 602 is deasserted. This current injection reduces the start-up time of the LFO to less than 1 microsecond.

Figure 7:
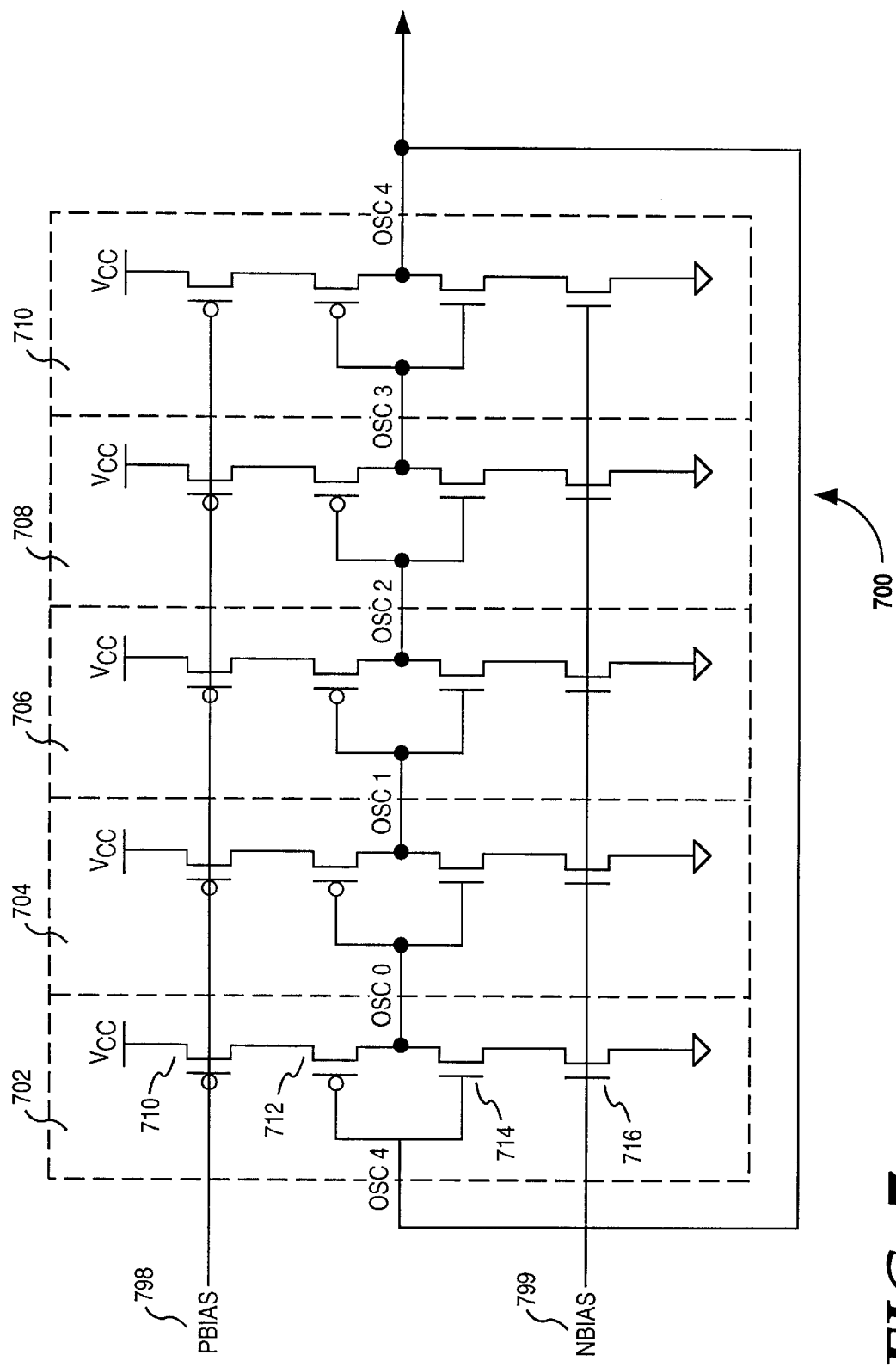
FIG. 7 is a schematic of the ring oscillator circuit of one embodiment.

FIG. 7 is a schematic of the ring oscillator circuit 700 of one embodiment. This ring oscillator comprises five stages 702–710, but is not so limited. The operation of a single stage of the ring oscillator circuit 700, the first stage 702, will be described for two possible inputs, as all stages operate the same with these inputs. The first stage 702 comprises two p-channel transistors 710 and 712 and two n-channel transistors 714 and 716. Transistors 710 and 716 act as current sources controlled by the PBIAS signal 798 and the NBIAS signal 799, respectively, from the bias circuit. Therefore, the PBIAS 798 and NBIAS 799 signals serve to limit the current through the oscillator stage 702 as will be described herein, and limiting the current allows the frequency of the oscillator to be reduced. Transistors 712 and 714 are coupled to an input voltage that selectively couples the current sources 710 and 716, respectively, to the output. The input to each stage 702–710 of the ring oscillator circuit 700 is the output from the preceding stage of the ring oscillator circuit 700.

As can be shown using techniques known in the art, the period and the frequency of the ring oscillator output is proportional to VCC and the bias current. However, as previously discussed, the bias current, or the current through the MOS resistor of the bias circuit, is also proportional to VCC. Therefore, as the period of the ring oscillator is proportional to VCC and inversely proportional to the bias current, the period of the ring oscillator is proportional to VCC and inversely proportional to VCC. The result is an LFO in which the period of the clock signal output is independent of VCC.

Figure 8:
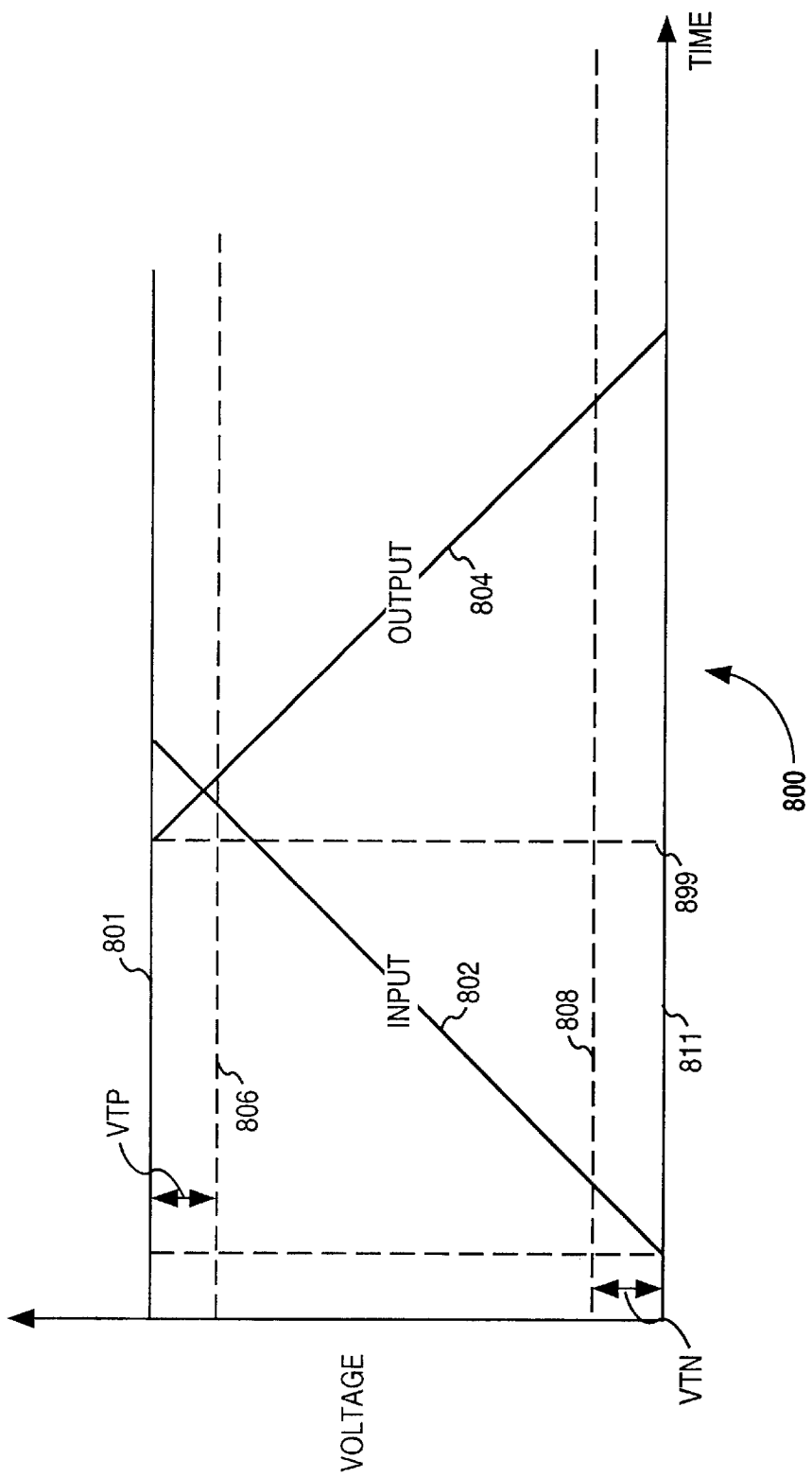
FIG. 8 is a graph of the input and output of one stage of the ring oscillator of one embodiment as the input transitions from a low state to a high state.

FIG. 8 is a graph 800 of the input 802 and output 804 of one stage of the ring oscillator of one embodiment as the input transitions from a low state 811 to a high state 801. With reference to FIG. 7, the input 802 starts out in a low state 811 which results in current flow through transistor 712 causing the output 804 to be in a high state 801. When the input 802 reaches a voltage level that is higher than an amount approximately equal to the threshold voltage of an n-channel device (Vtn) 808 above the low state voltage level 811 then transistor 714 allows current to flow. At this point, if the current through transistor 714 equals the current flowing through transistor 712 then the output 804 will not change state. As the input voltage 802 transitions higher than a Vtn 808 above the low voltage state 811, the output 804 remains high because the current flowing through transistor 712 equals the current flowing through transistor 714. The output 804 remains high until the input voltage 802 reaches a voltage level that is within an amount approximately equal to the threshold voltage of a p-channel device (Vtp) 806 of the high state voltage 801. At this point in time 899, transistor 712 prevents the flow of current and the current flowing through transistor 714 causes the output 804 to discharge at a constant rate until the output reaches the low voltage state 811.

Figure 9:
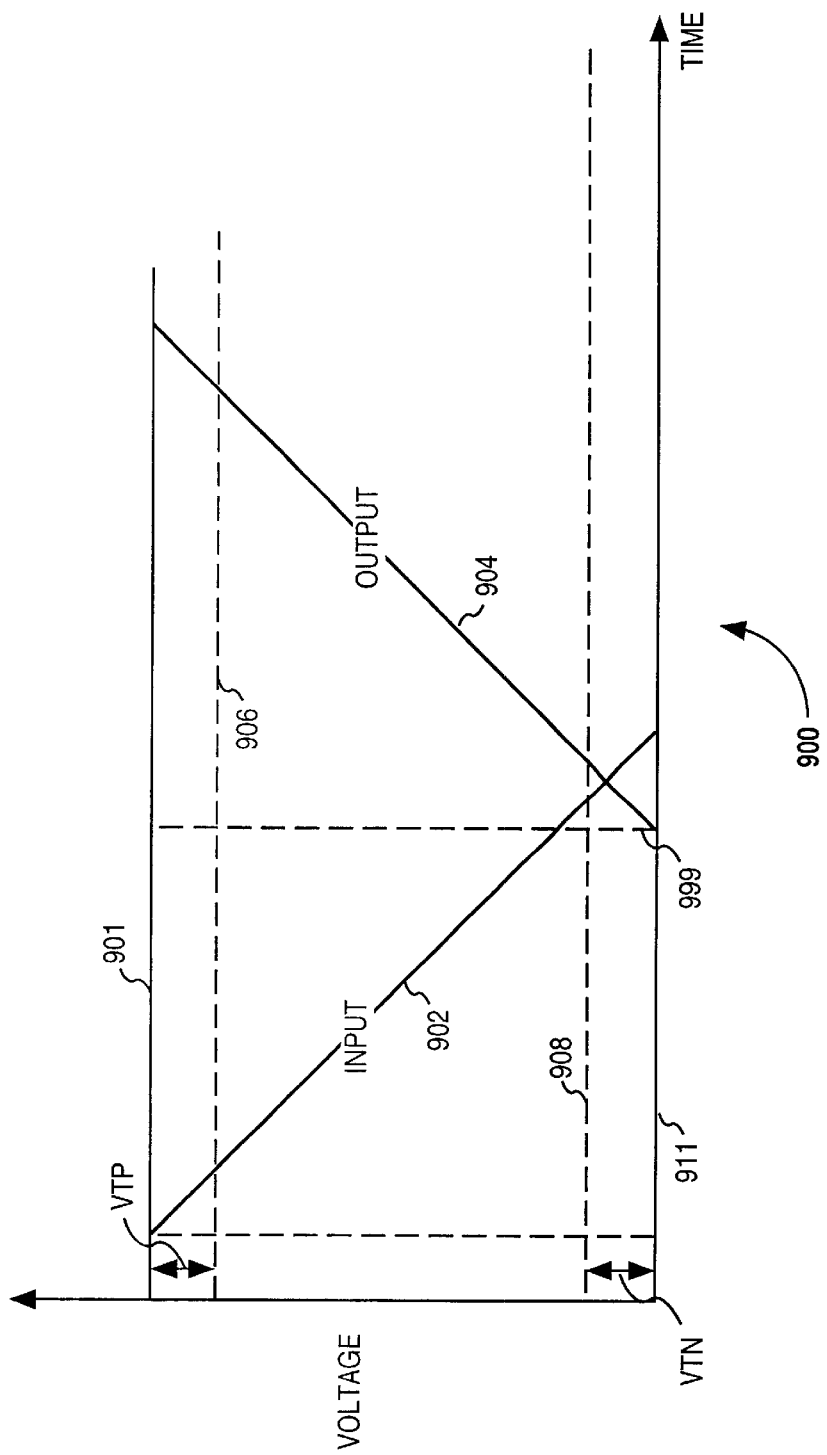
FIG. 9 is a graph of the input and output of one stage of the ring oscillator of one embodiment as the input transitions from a high state to a low state.

FIG. 9 is a graph 900 of the input 902 and output 904 of one stage of the ring oscillator of one embodiment as the input transitions from a high state 901 to a low state 911. With reference to FIG. 7, the input 902 starts out in a high state 901 which results in current flow through transistor 714 causing the output 904 to be in a low state 911. When the input 902 reaches a voltage level that is lower than an amount approximately equal to the threshold voltage of an p-channel device (Vtp) 906 below the high state voltage level 901 then transistor 712 allows current to flow. At this point, if the current through transistor 714 equals the current flowing through transistor 712 then the output 904 will not change state. As the input voltage 902 transitions lower than a Vtp 906 below the high voltage state 901, the output 904 remains low because the current flowing through transistor 712 equals the current flowing through transistor 714. The output 904 remains low until the input voltage 902 reaches a voltage level that is within an amount approximately equal to the threshold voltage of an n-channel device (Vtn) 908 of the low state voltage 911. At this point in time 999, transistor 714 prevents the flow of current and the current flowing through transistor 712 causes the output 904 to charge at a constant rate until the output reaches the high voltage state 901.

Figure 10:
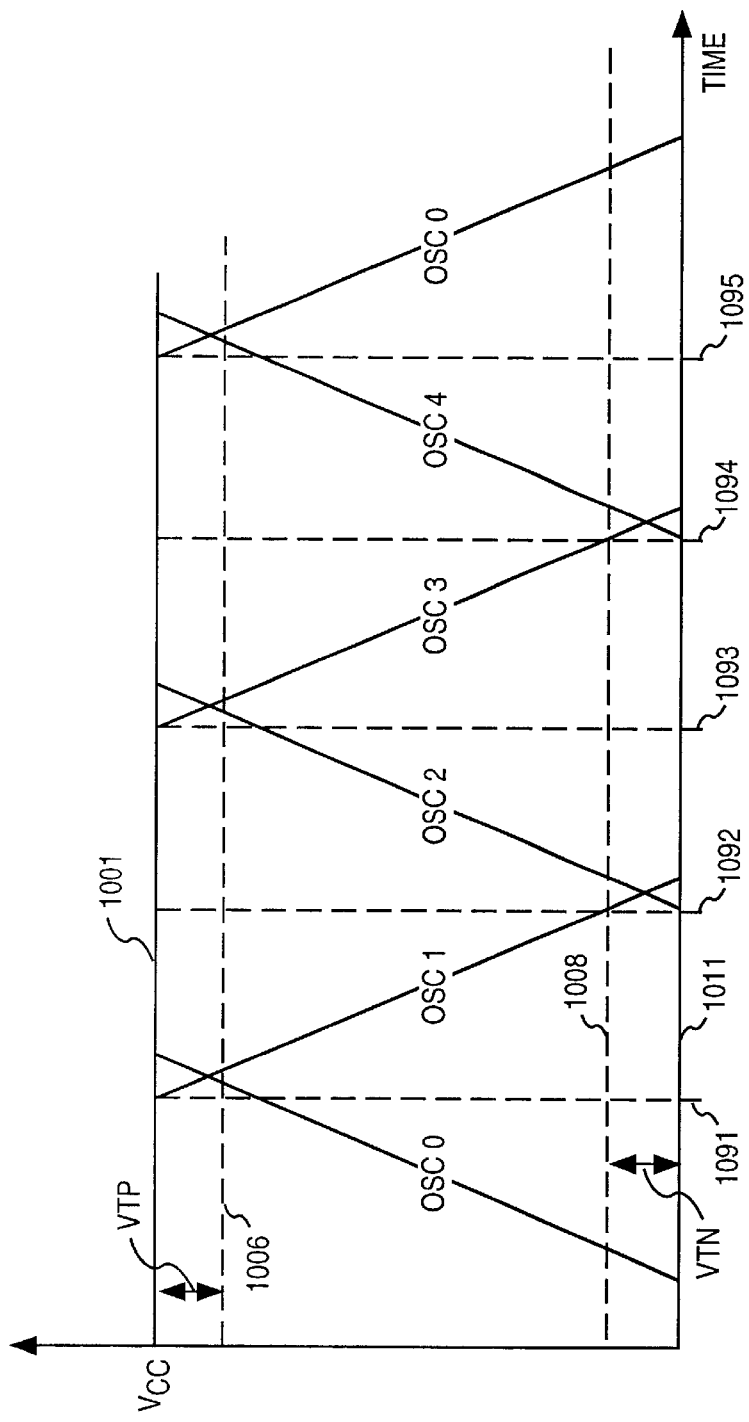
FIG. 10 is a graph of the input and output of the five stages of the ring oscillator of one embodiment.

FIG. 10 is a graph of the input and output of the five stages of the ring oscillator of one embodiment. With reference to FIG. 7, the inputs and outputs OSC0–OSC4 correspond to the inputs and outputs of each of the five stages 702–710 of the ring oscillator 700. The output of stage 702, OSC0, is the input to stage 704 and it starts out in a low state 1011 which causes the output of stage 704, OSC1, to be in a high state 1001. The output OSC1 remains high until the input voltage OSC0 reaches a voltage level that is within an amount approximately equal to the threshold voltage of a p-channel device (Vtp) 1006 of the high state voltage 1001. At this point in time 1091, the output OSC1 discharges at a constant rate until the output OSC1 reaches the low voltage state 1011.

The output of stage 704, OSC1, is the input to stage 706 and it starts out in a high state 1001 which causes the output of stage 706, OSC2, to be in a low state 1011. The output OSC2 remains low until the input voltage OSC1 reaches a voltage level that is within an amount approximately equal to the threshold voltage of an n-channel device (Vtn) 1008 of the low state voltage 1011. At this point in time 1092, the output OSC2 charges at a constant rate until the output OSC2 reaches the high voltage state 1001.

The output of stage 706, OSC2, is the input to stage 708 and it starts out in a low state 1011 which causes the output of stage 708, OSC3, to be in a high state 1001. The output OSC3 remains high until the input voltage OSC2 reaches a voltage level that is within an amount approximately equal to the threshold voltage of a p-channel device (Vtp) 1006 of the high state voltage 1001. At this point in time 1093, the output OSC3 discharges at a constant rate until the output OSC3 reaches the low voltage state 1011.

The output of stage 708, OSC3, is the input to stage 710 and it starts out in a high state 1001 which causes the output of stage 710, OSC4, to be in a low state 1011. The output OSC4 remains low until the input voltage OSC3 reaches a voltage level that is within an amount approximately equal to the threshold voltage of an n-channel device (Vtn) 1008 of the low state voltage 1011. At this point in time 1094, the output OSC4 charges at a constant rate until the output OSC4 reaches the high voltage state 1001.

The output of stage 710, OSC4, is the input to stage 702 and it starts out in a low state 1011 which causes the output of stage 702, OSC0, to be in a high state 1001. The output OSC0 remains high until the input voltage OSC4 reaches a voltage level that is within an amount approximately equal to the threshold voltage of a p-channel device (Vtp) 1006 of the high state voltage 1001. At this point in time 1095, the output OSC0 discharges at a constant rate until the output OSC0 reaches the low voltage state 1011. The cycle repeats as previously described as the signal continues to transition through the five stages 702–710 of the oscillator.

During any period when both the upper and lower switch transistors of the ring oscillator are on and allowing conduction, the output can drift, or wander, as a function of the difference in current due to device mismatch. A keeper circuit is coupled to the output of each biased ring oscillator stage of one embodiment in order to prevent the output from wandering. These zero-current keeper circuits reduce the threshold voltage mismatch sensitivity in the ring oscillator.

Figure 11:
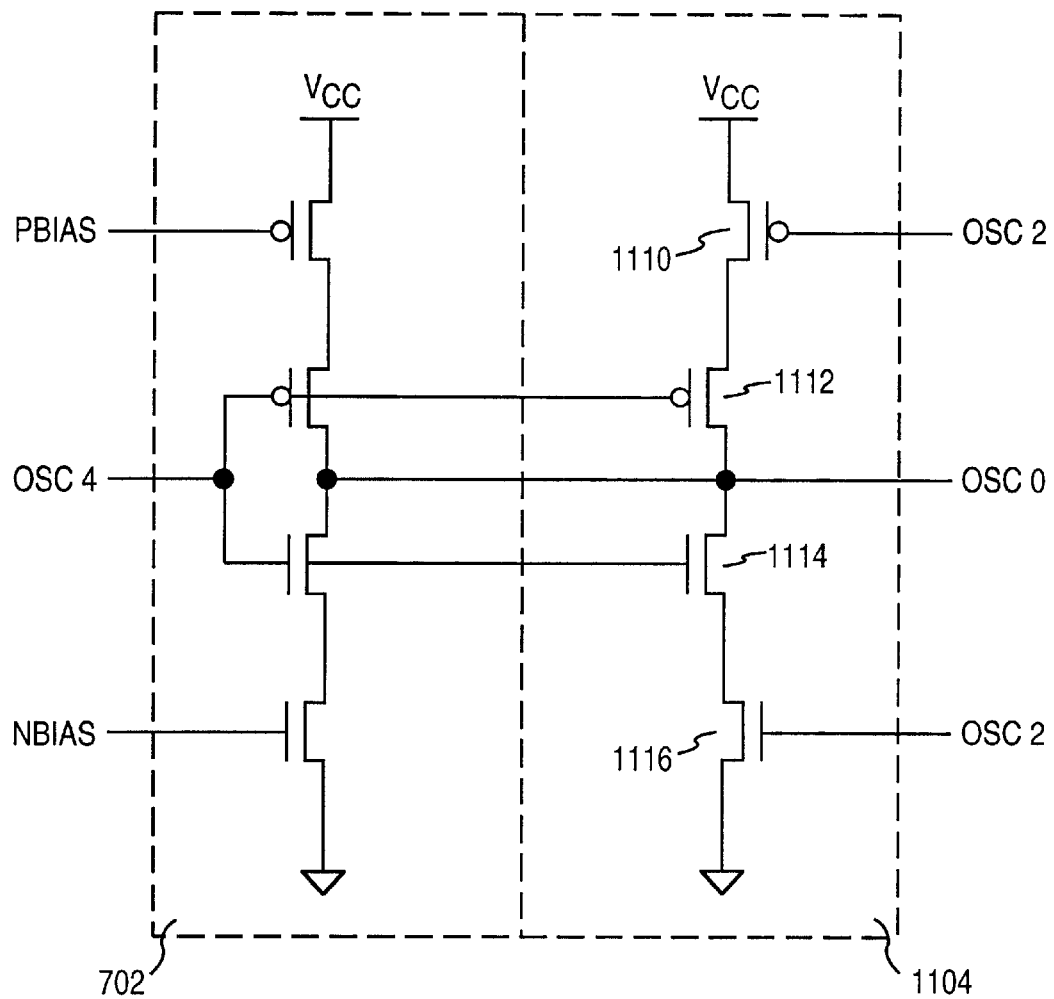
FIG. 11 is the first stage of the biased ring oscillator with the corresponding keeper circuit of one embodiment.

FIG. 11 is the first stage of the biased ring oscillator 702 with the corresponding keeper circuit 1104 of one embodiment, with reference to FIG. 7. The keeper circuit 1104 comprises two p-channel transistors 1110 and 1112 and two n-channel transistors 1114 and 1116. The keeper circuit 1104 functions to selectively hold the output of a biased ring oscillator stage at either a high state or a low state, thereby preventing the output from wandering from the high or low state prior to receiving the proper input signal to effect a state change in the output.

The gates of keeper circuit transistors 1112 and 1114 are controlled by the output signal from the preceding stage of the biased ring oscillator. For example, the gates of keeper circuit transistors 1112 and 1114 of the first stage of the ring oscillator 702 are controlled by the output signal OSC4 from the fifth stage of the ring oscillator 710. The output of a later stage of the biased ring oscillator 704–710 is used to select either the pull-up or the pull-down side of the keeper circuit 1104. The selection of a later stage of the biased ring oscillator for control of the keeper circuit 1104 is based on two factors: the output of the later stage has a polarity that is opposite from the pre-transition polarity of the keeper circuit 1104 input signal; and, the output of the later stage selected for control should be static at the time the input to the keeper circuit 1104 is transitioning. For example, with reference to FIG. 10, the pre-transition polarity of the stage 702 input, OSC4, is the low state, so the output of the later stage selected for control should be in the high state. As for the second selection factor, during the time that the input of the first stage of the ring oscillator, OSC4, is transitioning, only OSC0 and OSC3 are transitioning. Therefore, OSC2 meets the second selection factor. The first selection factor is also satisfied by OSC2, so OSC2 is the gate control signal for keeper circuit transistors 1110 and 1116.

In operation, as the output of stage 710, OSC4, transitions from high to low, OSC0 should remain low until the OSC4 voltage level is within an amount approximately equal to the threshold voltage of an n-channel device (Vtn) of the low state voltage. The output of stage 706, OSC2, is high at this point which selects the pull-down side, transistor 1116, of keeper circuit 1104. Transistor 1116 holds OSC0 in the low state until OSC4 reaches a voltage level that is within an amount approximately equal to the threshold voltage of an n-channel device (Vtn) of the low state voltage.

Figure 12:
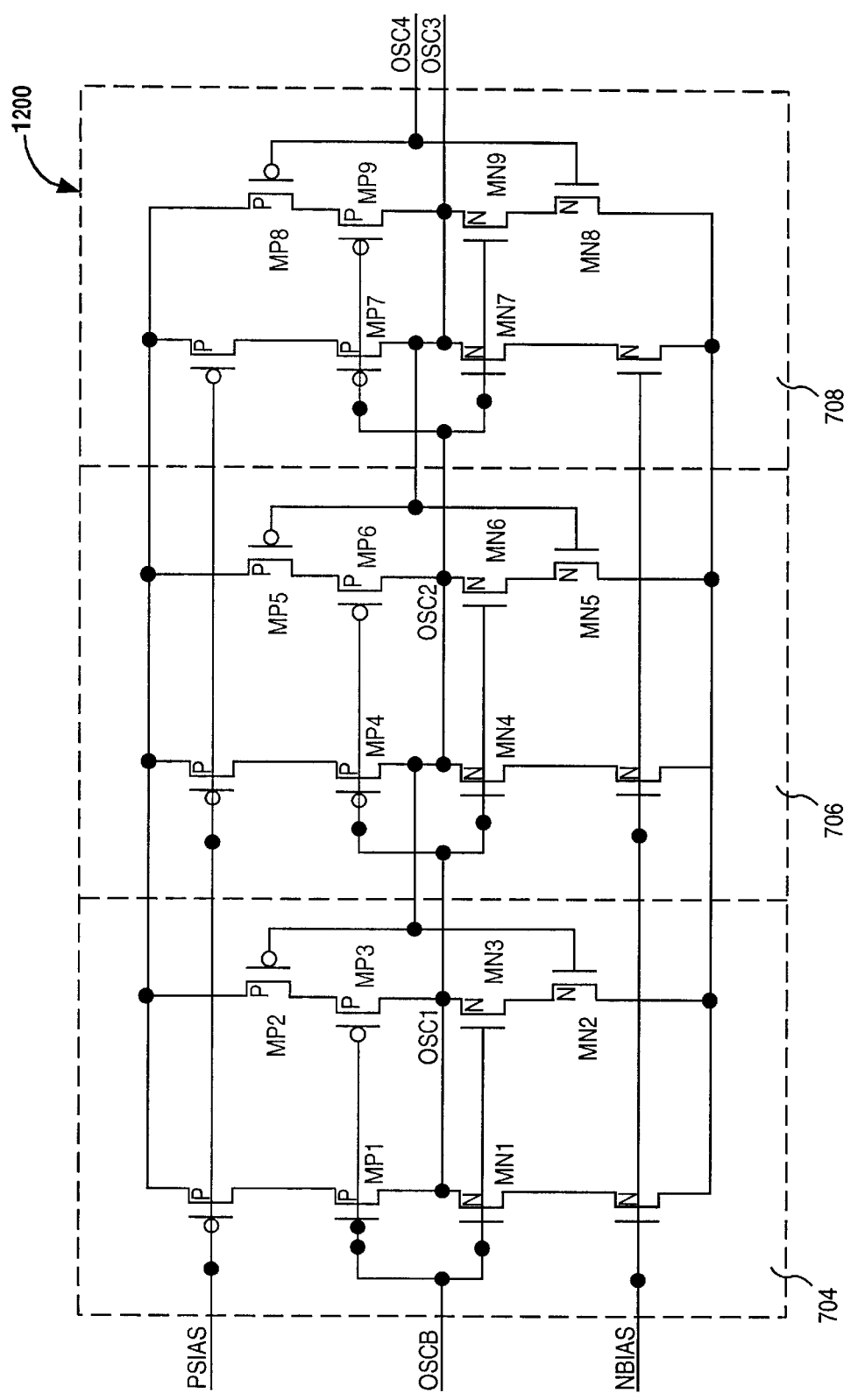
FIG. 12 is three stages of the ring oscillator with the corresponding keeper circuits of one embodiment.
Figure 13:
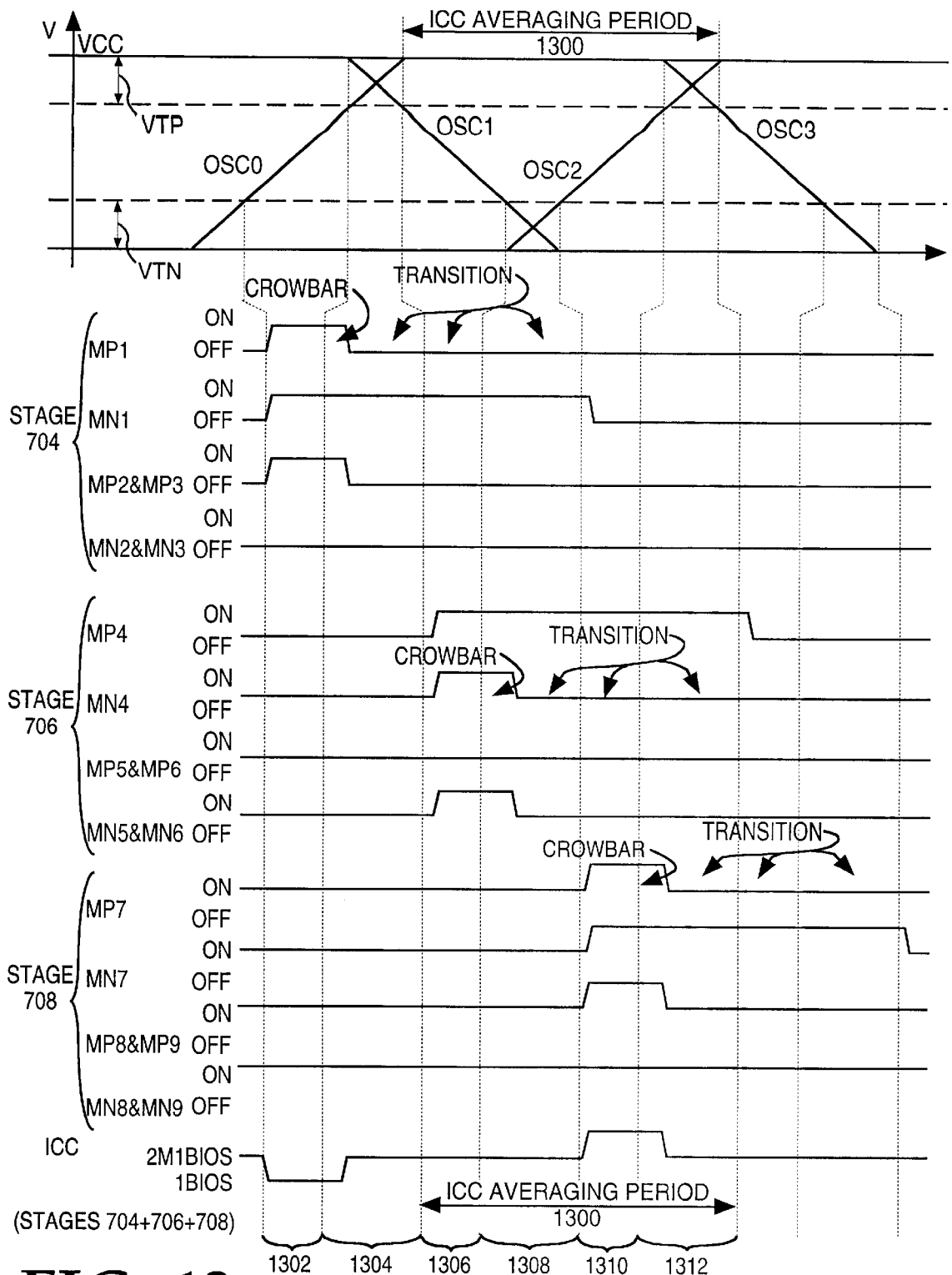
FIG. 13 is a graph of the input and output of three stages of the ring oscillator of one embodiment with the current consumed during operation of the three stages.

A typical prior art frequency oscillator consumed a current approximately equal to two times the bias current. The low frequency oscillator described herein reduces the current consumed to a current approximately equal to 1.25 times the bias current, or approximately half of the current consumed by the typical prior art frequency oscillator, as will be shown herein. With reference to FIG. 7, FIG. 12 is three stages 704–708 of the ring oscillator comprising and LFO subsection with the corresponding keeper circuits of one embodiment. FIG. 13 is a graph of the input and output of three stages 704–708 of the ring oscillator of one embodiment with the current consumed during operation of the three stages 704–708. Each stage of the ring oscillator can be in one of two states: transition; and, crowbar. A stage of the ring oscillator is in the transition state when the output of that stage is transitioning. A stage of the ring oscillator is in the crowbar state when the input of the stage is in transition, or the output of the preceding stage is in transition, but the output of the stage has not started to transition. A stage in the transition state draws a current approximately equal to bias current when the output is transitioning from a low state to a high state. A stage in the transition state draws no current when the output is transitioning from a high state to a low state. A stage in the crowbar state draws a current approximately equal to bias current; this current is the simultaneous conduction current consumed during the time that both the p-channel and the n-channel transistors are conducting thereby allowing the shunting of current from VCC to ground.

With reference to FIG. 13, during subperiod 1302 stage 704 is in the crowbar state so it is drawing current approximately equal to the bias current, and stages 706 and 708 are off and drawing no current. Therefore, the LFO subsection 1200 is consuming current approximately equal to the bias current during subperiod 1302.

During subperiod 1304 the output of stage 704 is transitioning from a high state to a low state so it is drawing no current, and stages 706 and 708 are off and drawing no current. Therefore, the LFO subsection 1200 is consuming approximately no current during subperiod 1304.

During subperiod 1306 the output of stage 704 is transitioning from a high state to a low state so it is drawing no current, and stage 706 is in the crowbar state so it is drawing current approximately equal to the bias current, and stage 708 is off and drawing no current. Therefore, the LFO subsection 1200 is consuming current approximately equal to the bias current during subperiod 1306.

During subperiod 1308 the output of stage 704 is transitioning from a high state to a low state so it is drawing no current, and the output of stage 706 is transitioning from a low state to a high state so it is drawing current approximately equal to the bias current, and stage 708 is off and drawing no current. Therefore, the LFO subsection 1200 is consuming current approximately equal to the bias current during subperiod 1308.

During subperiod 1310, stage 704 is off and drawing no current, and the output of stage 706 is transitioning from a low state to a high state so it is drawing current approximately equal to the bias current, and stage 708 is in the crowbar state so it is drawing current approximately equal to the bias current. Therefore, the LFO subsection 1200 is consuming current approximately equal to two times the bias current during subperiod 1310.

During subperiod 1312, stage 704 is off and drawing no current, and the output of stage 706 is transitioning from a low state to a high state so it is drawing current approximately equal to the bias current, and stage 708 is transitioning from a high state to a low state so it is drawing no current. Therefore, the LFO subsection 1200 is consuming current approximately equal to the bias current during subperiod 1312.

The average current consumption of the LFO, exclusive of the bias circuit, is calculated over one period of oscillation 1300. During the period of oscillation 1300 the stages of the LFO 702 and 710 not included in LFO subsection 1200 are not drawing current. Consequently, the average current of the LFO can be determined by analyzing the current consumed by LFO subsection 1200. The period of oscillation 1300 is comprised of subperiods 1306–1312. As shown in FIG. 13, the average current consumed by the LFO subsection 1200 over one period 1300 is approximately equal to 1.25 times the bias current. Thus, the LFO reduces the current consumed by approximately 50% over that of the typical prior art frequency oscillator.

Current consumption in a counter circuit can be reduced by providing an input signal to the counter circuit that has a fast edge rate. This is accomplished in one embodiment by coupling a zero-current edge sharpener circuit between the ring oscillator and the counter circuit. Therefore, the output of the biased ring oscillator is coupled to an edge sharpener circuit in one embodiment.

Figure 14:
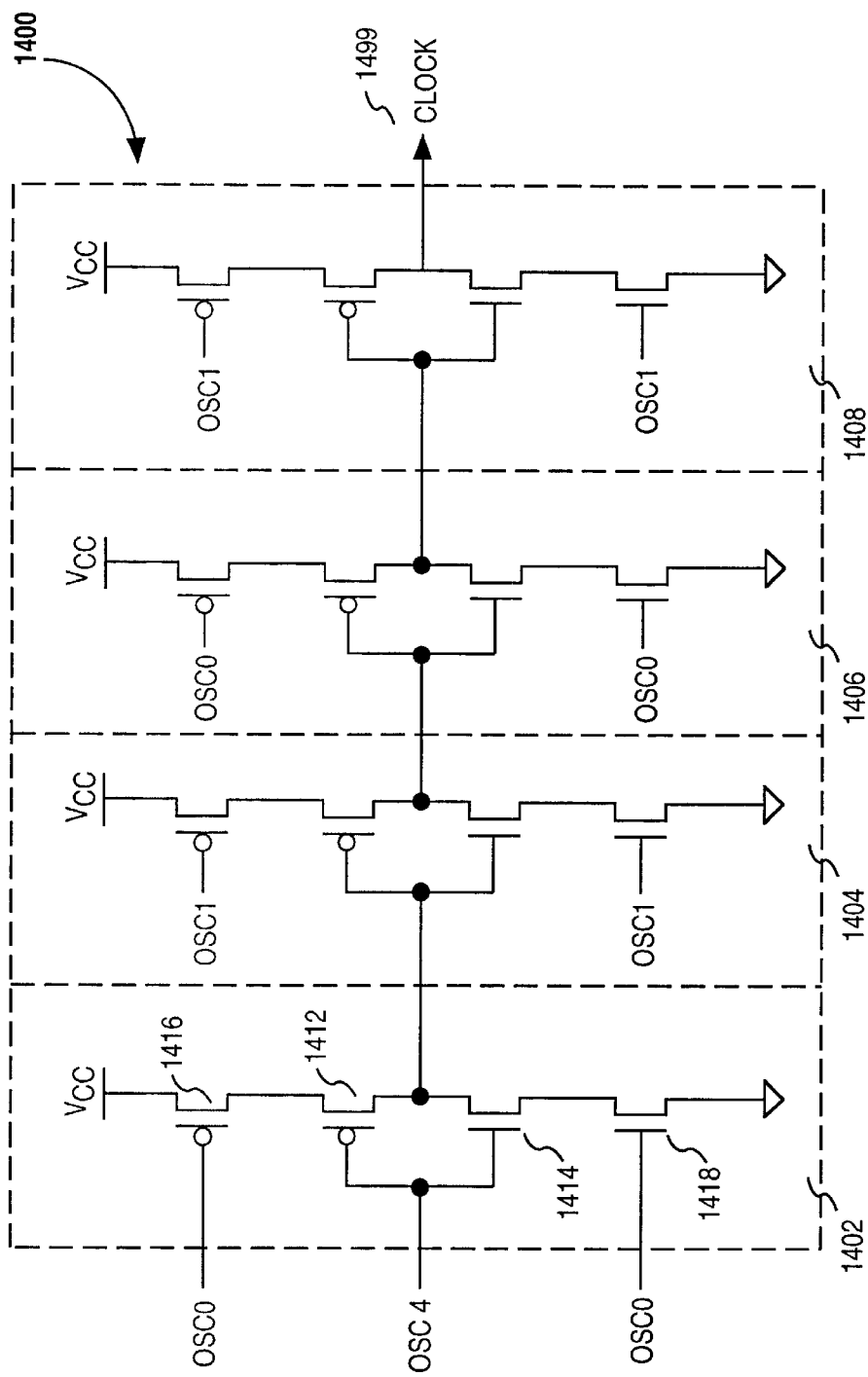
FIG. 14 is the edge sharpener circuit of one embodiment.

FIG. 14 is the edge sharpener circuit 1400 of one embodiment. The edge sharpener circuit 1400 increases the ramp rate of the biased ring oscillator output signal in order to reduce the current consumption of the counter. The edge sharpener circuit comprises four stages 1402–1408 where each stage comprises four transistors. A single stage of the edge sharpener circuit 1400 is described herein as all four stages are of the same circuit configuration except for the origin of the control signals. Stage 1402 comprises two input transistors, one p-channel 1412 and one n-channel 1414, each having their gates controlled by an input signal. The input signal to the first stage 1402 of the edge sharpener circuit is the output OSC4 from the fifth stage of the biased ring oscillator. The inputs to stages 1404–1408 of the edge sharpener circuit 1400 are the outputs from the preceding stages 1402–1406 of the edge sharpener circuit 1400, respectively.

Each of the input transistors 1412 and 1414 are coupled to a control transistor. Input transistor 1412 is coupled to a p-channel control transistor 1416 while input transistor 1414 is coupled to an n-channel control transistor 1418. Each stage of the edge sharpener circuit 1400 is preconditioned by coupling the gates of the control transistors 1416 and 1418 to the output signals of a stage of the biased ring oscillator. With reference to FIG. 7, the gates of the control transistors of stages 1402 and 1406 are coupled to the output OSC0 of stage 702 of the biased ring oscillator 700. The gates of the control transistors of stages 1404 and 1408 are coupled to the output OSC1 of stage 704 of the biased ring oscillator 700. These control signals initialize the edge sharpener circuit so that either the pull-up or pull-down path is activated for each transition. In this manner, each successive edge sharpener stage 1402–1408 further increases the ramp rate of the input signal, OSC4.

The output 1499 of the edge sharpener circuit 1400 is coupled to a counter in one embodiment. This counter functions as a frequency divider in creating a 200 millisecond clock from the 100 microsecond ring oscillator. Frequency division allows for a faster ring oscillator, and a faster oscillator requires less silicon area. The use of this counter reduces the amount of silicon area required for the LFO because it reduces the number of ring oscillator stages required while eliminating the need for large capacitors. The output of the edge sharpener circuit 1400 is coupled to a ripple counter in one embodiment. An alternate embodiment uses a synchronous counter.

Figure 15:
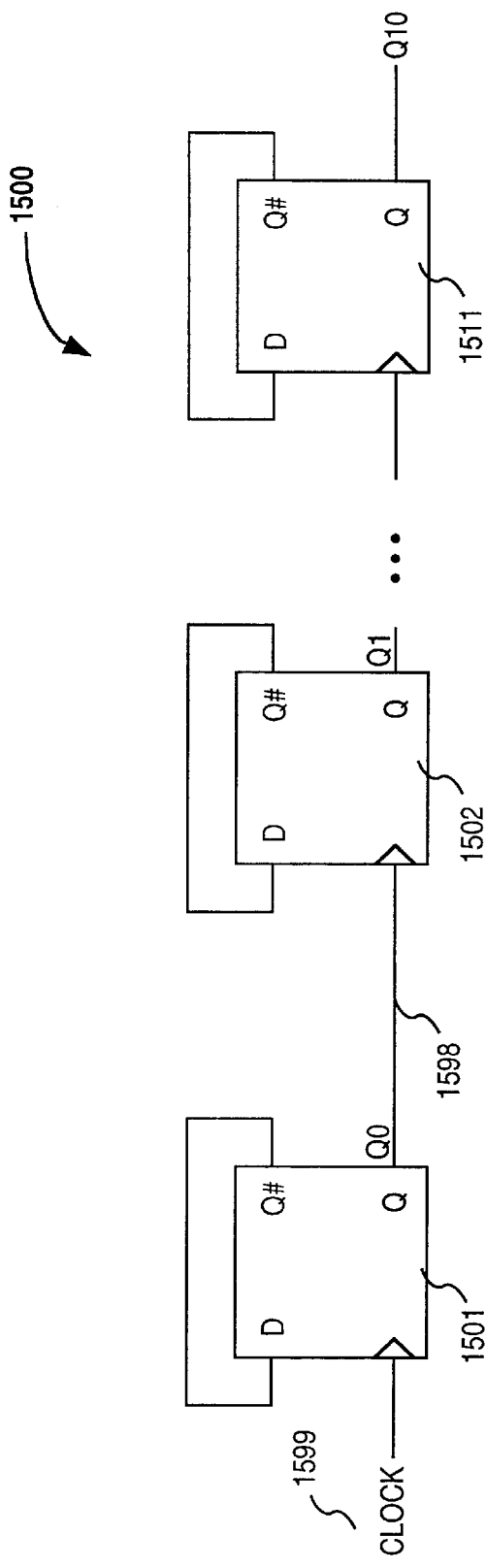
FIG. 15 is the 11-bit ripple counter of one embodiment.

FIG. 15 is the 11-bit ripple counter 1500 of one embodiment. The advantage provided by the ripple counter over the synchronous counter is that the clock loading is small in the ripple counter because the output of one clock stage serves as the input for the following clock stage. This results in reduced current consumption.

The ripple counter comprises eleven stages 1501–1511. The input 1599 to the first stage 1501 is the output signal from the edge sharpener circuit. The input 1598 to the second stage 1502 is the output of the first stage 1501. In this manner each stage 1501–1511 provides an output clock signal having a period that is twice as long as the period of the input clock signal of that stage. As previously discussed, the period of the clock signal output from each stage of the counter is independent of VCC.

Figure 16:
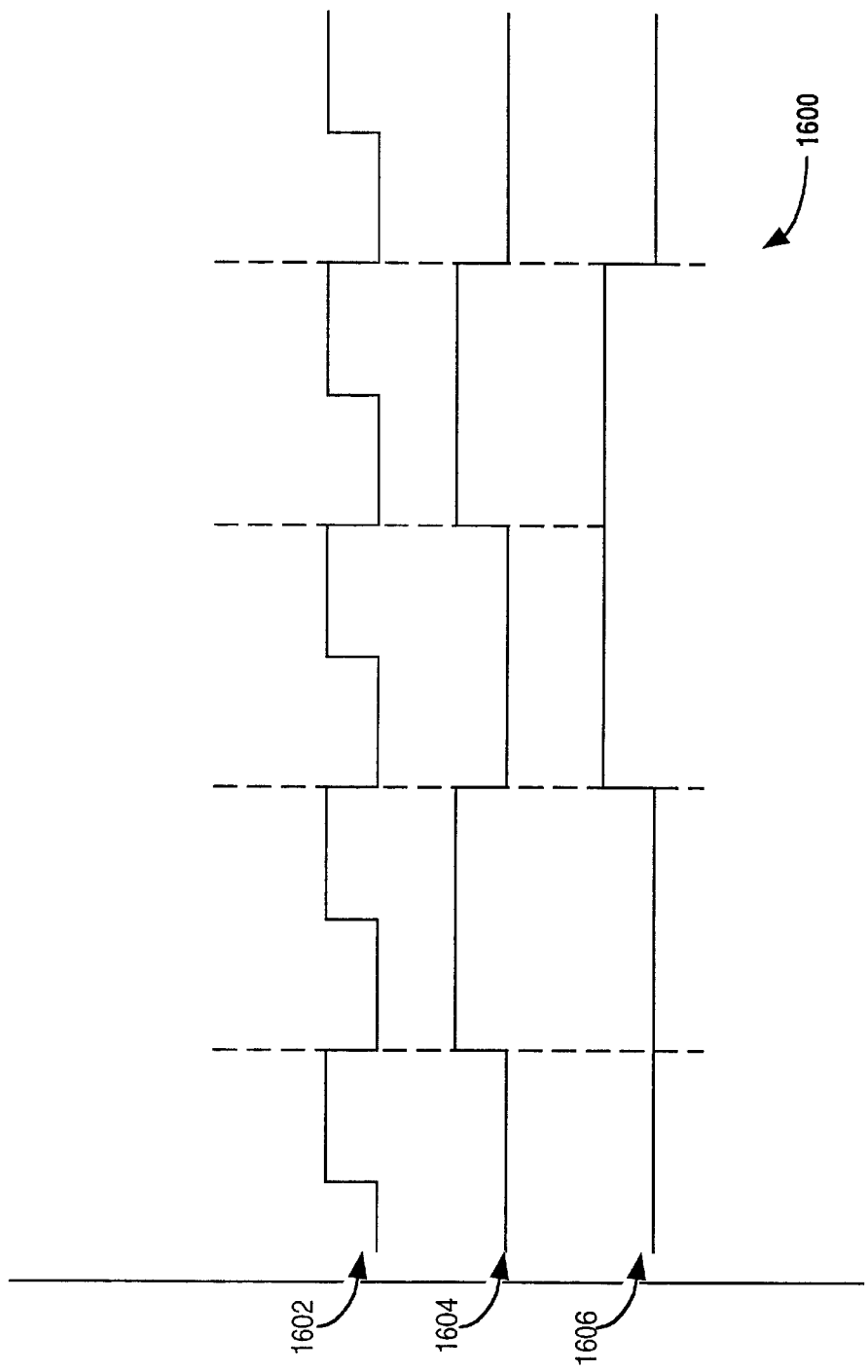
FIG. 16 is a clock timing diagram 1600 of one embodiment.

FIG. 16 is a clock timing diagram 1600 of one embodiment. With reference to FIG. 15, signal 1602 is representative of the output signal from the edge sharpener circuit that is input into stage 1501 of the ripple counter 1500. Signal 1604 is representative of the output signal from stage 1501 of the ripple counter 1500 where the period of signal 1604 is twice the period of signal 1602. Signal 1606 is representative of the output signal from stage 1502 of the ripple counter 1500 where the period of signal 1606 is twice the period of signal 1604. Consequently, using an output from each stage of the ripple counter 1500, the counter provides eleven outputs having a range of frequencies. One embodiment of the LFO provides clock outputs having frequencies that range from 100 microseconds to 200 milliseconds.

While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An oscillator comprising:
   a bias circuit comprising a metal oxide semiconductor (MOS) resistor;
   a biased ring oscillator coupled to the bias circuit, the biased ring oscillator comprising a plurality of current limiting transistors; and
   a counter coupled with an output of the biased ring oscillator, wherein the counter simultaneously generates and provides multiple clock signals of different frequencies external to the counter;
   wherein the oscillator is disabled during program cycles and erase cycles of a nonvolatile writeable memory serviced by the oscillator.

2. The oscillator of claim 1, wherein the MOS resistor forms one leg of a cross-coupled current mirror, the bias circuit providing at least one biasing voltage.

3. The oscillator of claim 1, wherein a low voltage detector is coupled to provide a starting current to the bias circuit.

4. The oscillator of claim 1, wherein the biased ring oscillator comprises at least one stage, the at least one stage comprising a plurality of transistors forming a current mirror.

5. The oscillator of claim 4, wherein the biased ring oscillator comprises five stages.

6. The oscillator of claim 4, wherein each stage of the biased ring oscillator comprises a keeper circuit, the keeper circuit stabilizing the output of each stage of the biased ring oscillator at a voltage level.

7. The oscillator of claim 6, wherein the keeper circuit comprises a plurality of transistors, the keeper circuit of a first stage of the biased ring oscillator coupled to receive control inputs from an output of a second stage of the biased ring oscillator.

8. The oscillator of claim 7, wherein the second stage is in a static state at the time the first stage is transitioning between states, the static state having a polarity that is opposite to the polarity to which the first state is transitioning.

9. The oscillator of claim 4, wherein the biased ring oscillator is coupled to an edge sharpener circuit, the edge sharpener circuit increasing the transition speed of the biased ring oscillator signal.

10. The oscillator of claim 9, wherein the edge sharpener circuit comprises a plurality of stages, wherein each stage comprises a plurality of transistors coupled to receive control inputs from an output of at least one stage of the biased ring oscillator.

11. The oscillator of claim 10, wherein the edge sharpener circuit comprises four stages, wherein the first and third stages receive control inputs from a first stage of the biased ring oscillator, and wherein the second and fourth stages receive control inputs from a second stage of the biased ring oscillator.

12. The oscillator of claim 1, wherein the counter is a ripple counter comprising at least one stage, the ripple counter coupled to the edge sharpener circuit.

13. The oscillator of claim 12, wherein the counter comprises eleven stages, each stage providing an output signal having a different frequency.

14. The oscillator of claim 1, wherein the oscillator is used in a nonvolatile writeable memory.

15. The oscillator of claim 1, wherein the oscillator is used in a multiple level cell nonvolatile writeable memory.

16. An oscillator for use in a nonvolatile writeable memory, the oscillator comprising:
 a bias circuit comprising a metal oxide semiconductor (MOS) resistor;
 a biased ring oscillator coupled to the bias circuit, the biased ring oscillator comprising a plurality of current limiting transistors; and
 a counter coupled with an output of the biased ring oscillator, wherein the counter simultaneously generates and provides multiple clock signals of different frequencies external to the counter;
 wherein the oscillator is disabled during program cycles and erase cycles of the nonvolatile writeable memory.

17. The oscillator of claim 16, wherein the MOS resistor of the bias circuit forms one leg of a cross-coupled current mirror, the bias circuit providing at least one biasing voltage.

18. The oscillator of claim 16, wherein the biased ring oscillator comprises at least one stage, the at least one stage comprising a plurality of transistors forming a current mirror.

19. The oscillator of claim 18, wherein each stage of the biased ring oscillator comprises a keeper circuit, the keeper circuit stabilizing the output of each stage of the biased ring oscillator at a voltage level in response to signals from an output of a different stage of the biased ring oscillator.

20. The oscillator of claim 19, wherein the biased ring oscillator is coupled to an edge sharpener circuit, the edge sharpener circuit comprising a plurality of transistors coupled to increase the transition speed of the biased ring oscillator signal in response to signals from an output of at least one stage of the biased ring oscillator.

21. The oscillator of claim 16, wherein the counter is a ripple counter coupled to divide a frequency of the biased ring oscillator, the ripple counter comprising at least one stage providing at least one output signal, each of the at least one output signals having a different frequency.

22. The oscillator of claim 16, wherein the oscillator is used in a multiple level cell nonvolatile writeable memory.

* * * * *